United States Patent
Harada et al.

(10) Patent No.: US 11,846,651 B2
(45) Date of Patent: Dec. 19, 2023

(54) ELECTROSTATIC ACTUATOR AND PHYSICAL QUANTITY SENSOR

(71) Applicant: DENSO CORPORATION, Kariya (JP)

(72) Inventors: Shota Harada, Kariya (JP); Keitaro Ito, Kariya (JP); Tomoya Jomori, Kariya (JP); Hideo Yamada, Kariya (JP); Yuuki Inagaki, Kariya (JP); Teruhisa Akashi, Kariya (JP); Yoshiyuki Hata, Kariya (JP)

(73) Assignee: DENSO CORPORATION, Kariya (JP)

( * ) Notice: Subject to any disclaimer, the term of this patent is extended or adjusted under 35 U.S.C. 154(b) by 520 days.

(21) Appl. No.: 17/082,199

(22) Filed: Oct. 28, 2020

(65) Prior Publication Data

US 2021/0041475 A1 Feb. 11, 2021

Related U.S. Application Data

(63) Continuation of application No. PCT/JP2019/022550, filed on Jun. 6, 2019.

(30) Foreign Application Priority Data

Jun. 11, 2018 (JP) .................. 2018-111336

(51) Int. Cl.
*G01P 3/44* (2006.01)
*B06B 1/04* (2006.01)
(Continued)

(52) U.S. Cl.
CPC ............... *G01P 3/44* (2013.01); *B06B 1/045* (2013.01); *B81B 3/0013* (2013.01); *B81B 7/04* (2013.01); *G01P 3/14* (2013.01)

(58) Field of Classification Search
CPC ... G01P 3/44; G01P 3/14; B06B 1/045; B81B 3/0013; B81B 7/04
(Continued)

(56) References Cited

U.S. PATENT DOCUMENTS 6,960,945 B1 * 11/2005 Bonin .................. G01D 5/2417
327/111
2014/0002202 A1 * 1/2014 Nozawa .................. H03B 5/30
331/156
(Continued)

FOREIGN PATENT DOCUMENTS

CN 204029730 * 12/2014 ............. H01H 50/16
EP 2749841 B1 * 12/2016 ......... G01C 19/5747

OTHER PUBLICATIONS

Translation of CN 204029730 (Year: 2014).*
(Continued)

*Primary Examiner* — Nathaniel T Woodward
(74) *Attorney, Agent, or Firm* — POSZ LAW GROUP, PLC (57) ABSTRACT

An electrostatic actuator includes a fixed electrode and a movable electrode arranged to face the fixed electrode. The movable electrode is configured to be displaceable with respect to the fixed electrode and a fixed portion. An attractive force acts between the movable electrode and the fixed portion. In the electrostatic actuator, a non-linear vibration of the movable electrode when a voltage is applied to the fixed electrode and the movable electrode is reduced by the attractive force acting between the movable electrode and the fixed portion.

8 Claims, 7 Drawing Sheets

(51) Int. Cl.
    *B81B 3/00*     (2006.01)
    *B81B 7/04*     (2006.01)
    *G01P 3/14*     (2006.01)

(58) Field of Classification Search
    USPC .......................................................... 73/493
    See application file for complete search history.

(56) References Cited

U.S. PATENT DOCUMENTS

2015/0168437 A1     6/2015    Jomori et al.
2016/0153781 A1     6/2016    Blomqvist et al.

OTHER PUBLICATIONS

Taheri-Tehrani, Parsa, et al. "Epitaxially-encapsulated quad mass gyroscope with nonlinearity compensation." 2016 IEEE 29th International Conference on Micro Electro Mechanical Systems (Mems). IEEE, 2016.

\* cited by examiner

FIG. 1

FIRST DIRECTION
SECOND DIRECTION

ELECTROSTATIC ACTUATOR AND PHYSICAL QUANTITY SENSOR

CROSS REFERENCE TO RELATED APPLICATION

This application is a continuation application of International Patent Application No. PCT/JP2019/022550 filed on Jun. 6, 2019, which designated the U.S. and based on and claims the benefits of priority of Japanese Patent Application No. 2018-111336 filed on Jun. 11, 2018. The entire disclosure of all of the above applications is incorporated herein by reference.

TECHNICAL FIELD

The present disclosure relates to an electrostatic actuator and a physical quantity sensor.

BACKGROUND

The electrostatic actuator includes a fixed electrode and a movable electrode, and vibrates the movable electrode by an electrostatic force that acts between the electrodes.

SUMMARY

The present disclosure aims to provide the electrostatic actuator and the physical quantity sensor capable of improving controllability.

According to one aspect of the present disclosure, an electrostatic actuator includes a fixed electrode and a movable electrode that is arranged so as to face the fixed electrode, and vibrates the movable electrode by an electrostatic force that acts between the electrodes. The movable electrode is displaceable with respect to the fixed electrode and a fixed portion, and an attractive force acts between the movable electrode and the fixed portion. Non-linear vibration of the movable electrode when a voltage is applied to the fixed electrode and the movable electrode is reduced by the attraction force acting between the movable electrode and the fixed portion.

Here, a parenthesized reference symbol attached to each constituent element or the like shows an example of the correspondence of the constituent element or the like and a specific constituent element or the like described in an embodiment to be described later.

DETAILED DESCRIPTION

In an assumable example, a gyro sensor or the like uses an electrostatic actuator that includes a fixed electrode and a movable electrode and that vibrates the movable electrode by an electrostatic force that acts between the electrodes. As the electrostatic actuator, a squeezed type in which each electrode is arranged perpendicular to a driving direction of the movable electrode and a slide type in which each electrode is a comb-tooth electrode having a protrusion parallel to the driving direction of the movable electrode are used.

In the squeezed type electrostatic actuator, since the movable electrode is displaced in the direction perpendicular to a facing surface, a distance between the electrode plates changes due to the displacement of the movable electrode, and the electrostatic force also changes accordingly. That is, a change in an amplitude of the movable electrode becomes non-linear with respect to an input power. On the other hand, in the slide type electrostatic actuator, the electrostatic force can be regarded as constant regardless of the displacement amount of the movable electrode, and the change in amplitude is proportional to the input power. Therefore, the slide type electrostatic actuator is easier to control the amplitude of the movable electrode than the squeezed type electrostatic actuator.

However, in any type of the electrostatic actuators, when the input voltage is increased and the amplitude of the movable electrode is increased, the resonance frequency changes due to a hard spring effect, so that there are multiple solutions of the amplitude with respect to the frequency of the input voltage. Therefore, the vibration becomes unstable. Therefore, if the amplitude is increased to improve the sensitivity of the gyro sensor, complicated control is required to stabilize the amplitude.

The present disclosure aims to provide the electrostatic actuator and the physical quantity sensor capable of improving controllability.

According to one aspect of the present disclosure, an electrostatic actuator includes a fixed electrode and a movable electrode that is arranged so as to face the fixed electrode, and vibrates the movable electrode by an electrostatic force that acts between the electrodes. The movable electrode is displaceable with respect to the fixed electrode and a fixed portion, and an attractive force acts between the movable electrode and the fixed portion. Non-linear vibration of the movable electrode when a voltage is applied to the fixed electrode and the movable electrode is reduced by the attraction force acting between the movable electrode and the fixed portion.

In this way, by applying an attractive force between the movable electrode and the fixed portion, it is possible to reduce the non-linear vibration of the movable electrode when a voltage is applied to the fixed electrode and the movable electrode. By reducing the non-linear vibration of the movable electrode, the amplitude range in which the solution of the amplitude of the movable electrode is uniquely determined with respect to the frequency of the input voltage is widened, and thus the controllability of the amplitude of the movable electrode is improved.

Hereinafter, embodiments of the present disclosure will be described with reference to the drawings. In the following embodiments, the same or equivalent parts are denoted by the same reference numerals as each other, and explanations will be provided to the same reference numerals.

First Embodiment

Figure 1:
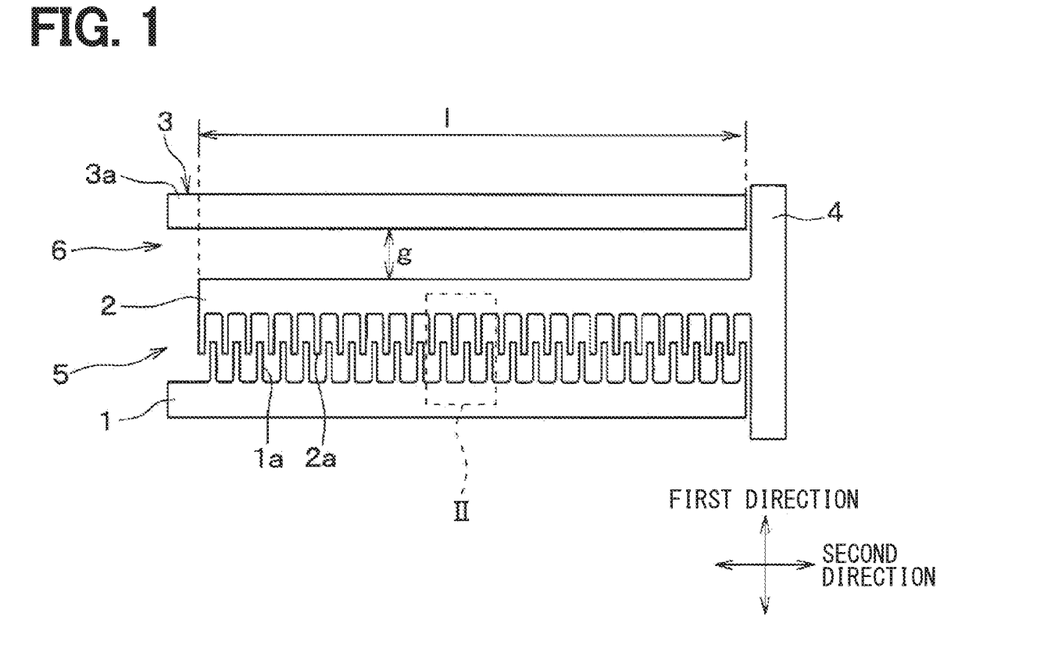
FIG. 1 is a plan view of an electrostatic actuator according to a first embodiment.

The first embodiment will be described. As shown in FIG. 1, an electrostatic actuator of the present embodiment includes a fixed electrode 1, a movable electrode 2, a fixed portion 3, and a beam portion 4. The electrostatic actuator of the present embodiment is a MEMS (abbreviation of Micro Electro Mechanical Systems) device formed by processing an SOI (abbreviation of Silicon on Insulator) substrate in which a support layer, a sacrificial layer, and an active layer are sequentially laminated. The support layer and the active layer are made of Si, and the sacrificial layer is made of SiO2. The fixed electrode 1, the movable electrode 2, the fixed portion 3, and the beam portion 4 are formed by subjecting the SOI substrate to processing such as etching. The electrostatic actuator may be made of SiC, Si3N4, Al, Fe, Cu, Ni or the like.

The fixed electrode 1 and the fixed portion 3 are composed of a part of the active layer of the SOI substrate, and are fixed to the support layer and the sacrificial layer. In the present embodiment, an attractive force acts between the movable electrode 2 and the fixed portion 3. Specifically, a part of the fixed portion 3 is the fixed electrode 3a. As will be described later, when a voltage is applied to the movable electrode 2 and the fixed electrode 3a, an electrostatic force acts between the movable electrode 2 and the fixed electrode 3a. The fixed electrode 1 and the fixed electrode 3a are configured as separate bodies. The fixed electrode 1 and the fixed electrode 3a correspond to the first and second fixed electrodes, respectively.

The movable electrode 2 and the beam portion 4 are formed by a part of the active layer of the SOI substrate. The sacrificial layer is removed under the movable electrode 2 and the beam portion 4, and the movable electrode 2 and the beam portion 4 are displaceable with respect to the support layer.

In the present embodiment, the fixed electrode 1, the movable electrode 2, and the fixed electrode 3a are rod-shaped, and a cross section of each electrode is rectangular. The fixed electrode 3a is arranged on a side opposite to the fixed electrode 1 with respect to the movable electrode 2. Each electrode is extended in parallel so that the fixed electrode 1 faces one surface of the movable electrode 2 and the fixed electrode 3a faces the other surface of the movable electrode 2. The surfaces of the movable electrode 2 and the fixed electrode 3a facing each other are flat surfaces.

An end of the movable electrode 2 is connected to the beam portion 4. A spring (not shown) or the like is formed on the SOI substrate, and the beam portion 4 is supported by a portion fixed to the support layer and the sacrificial layer in the active layer via the spring or the like.

A direction perpendicular to both a laminating direction of the support layer, the sacrificial layer, the active layer of the SOI substrate that constitutes the electrostatic actuator, and an extending direction of the fixed electrode 1 and the like is defined as a first direction, and a direction parallel to the extending direction of the fixed electrode 1 and the like is defined as a second direction. The movable electrode 2 and the beam portion 4 are displaceable in the first direction.

The fixed electrode 1 is formed with a protrusion 1a that protrudes in the first direction from a surface facing the movable electrode 2. Further, the movable electrode 2 is formed with a protrusion 2a protruding in the first direction from a surface facing the fixed electrode 1. At least one of the protrusions 1a and the protrusions 2a is formed in plural, and they are arranged alternately in the second direction. In the present embodiment, a plurality of protrusions 1a and a plurality of protrusions 2a are formed, and are arranged at equal intervals in the second direction, and the fixed electrode 1 and the movable electrode 2 are comb-shaped. In the present embodiment, the protrusion 1a corresponds to a first protrusion and the protrusion 2a corresponds to a second protrusion.

An electrode pair composed of the fixed electrode 1 and the movable electrode 2 is referred to as an electrode pair 5. The electrode pair 5 corresponds to the first electrode pair. When a voltage is applied to the electrode pair 5 and an electrostatic force acts on the movable electrode 2, the movable electrode 2 is displaced in the first direction as described above. Thereby, even if the movable electrode 2 is displaced, a distance between the protrusions 1a and 2a is maintained. In this way, the electrode pair 5 constitutes a slide type electrostatic actuator.

An electrode pair composed of the movable electrode 2 and the fixed electrode 3a is referred to as an electrode pair 6. The electrode pair 6 corresponds to a second electrode pair. The electrode pair 6 constitutes a squeezed type electrostatic actuator, and a voltage is applied to the electrode pair 6 to exert an electrostatic force on the movable electrode 2 to displace the movable electrode 2 in the first direction. Then, a distance between the movable electrode 2 and the fixed electrode 3a changes.

Figure 2:
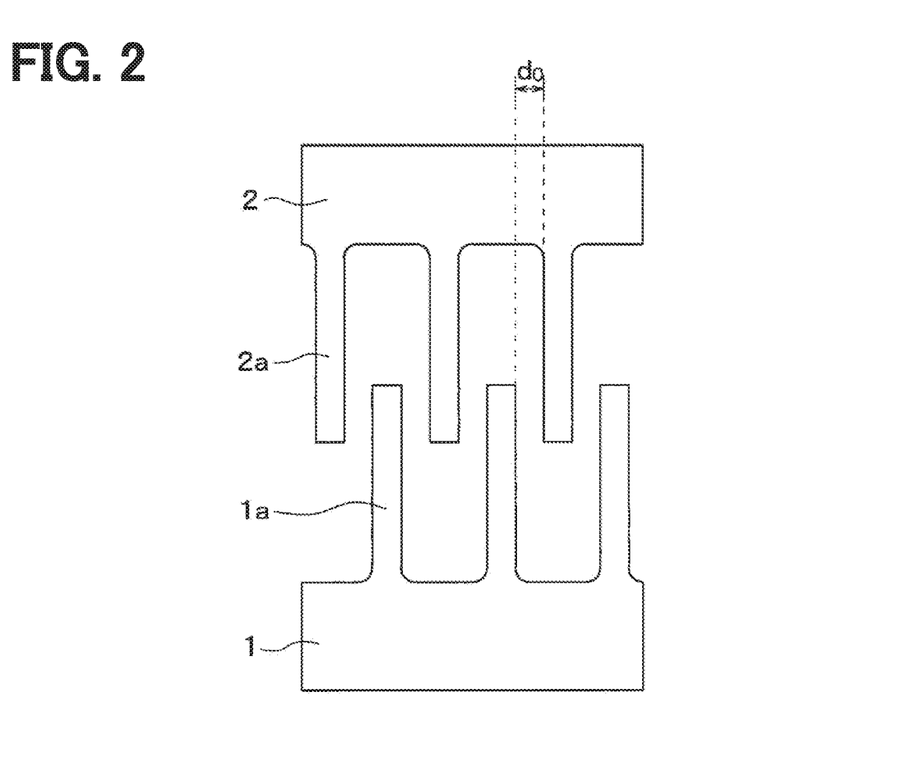
FIG. 2 is an enlarged view of a portion II in FIG. 1.

A method of controlling an amplitude of the movable electrode 2 in the present embodiment will be described. A dielectric constant of vacuum is $\varepsilon_0$, the number of protrusions 1a and 2a is $n_0$, and the voltage applied between the fixed electrode 1 and the movable electrode 2 is $V_1$. As shown in FIG. 2, a distance between the protrusion 1a and the protrusion 2a is $d_0$, a thickness of the fixed electrode 1 and the movable electrode 2 is h, and a displacement of the movable electrode 2 in the first direction is x. A direction from the fixed electrode 1 to the fixed electrode 3a is a positive direction of x. An electrostatic force $F_1$ acting between the fixed electrode 1 and the movable electrode 2 changes depending on the voltage $V_1$ and the displacement x, but the change in the electrostatic force $F_1$ due to the displacement x is minute, and if this changes is ignored, the electrostatic force $F_1$ is expressed by Formula 1.

$$F_1 \approx \frac{\varepsilon_0 n_0 h}{d_0} V_1^2 \qquad \text{[Formula 1]}$$

Further, a facing area between the movable electrode 2 and the fixed electrode 3a is S, a voltage applied between the movable electrode 2 and the fixed electrode 3a is $V_2$, and a distance from the movable electrode 2 and the fixed electrode 3a when $V_1=V_2=0$ is g. An electrostatic force $F_2$ acting between the movable electrode 2 and the fixed electrode 3a is expressed by Formula 2. As described above, the electrostatic force $F_2$ changes depending on the voltage $V_2$ and the displacement x, and increases as the distance between the movable electrode 2 and the fixed electrode 3a decreases. Since the displacement x varies non-linearly due to fluctuations in the voltage $V_2$, it is complicated to control the amplitude of the movable electrode 2 in the squeezed type electrode pair 6.

$$F_2 \approx \frac{1}{2} \frac{\varepsilon_0 S V_2^2}{(g-x)^2} \quad \text{[Formula 2]}$$

Figure 3:
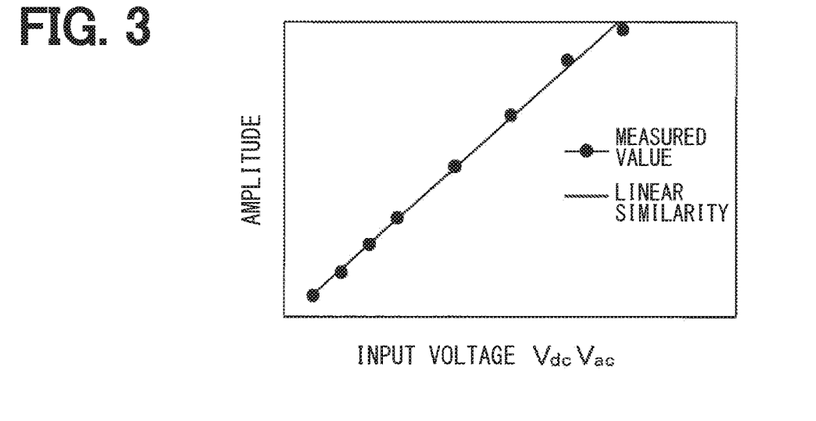
FIG. 3 is a diagram showing a relationship between an input voltage and an amplitude of a movable electrode.

Therefore, in the present embodiment, the displacement x is controlled by setting the voltage $V_1$ to be the sum of the DC voltage $V_{dc}$ and the AC voltage $V_{ac} \cos \omega t$. By setting the voltage $V_1$ in the above way, a relationship between an input voltage $V_{dc}V_{ac}$ and the amplitude of the movable electrode 2 becomes as shown in FIG. 3. As described above, in the present embodiment, the amplitude changes linearly with respect to the input voltage $V_{dc}V_{ac}$, so that the amplitude can be easily controlled.

When a mass of a movable portion including the movable electrode 2 and the beam portion 4 is m, a damping coefficient is c, a spring constant of the spring (not shown) is k, and a force acting on the movable electrode 2 is F, an equation of motion of the movable electrode 2 is expressed by Formula 3.

$$m\frac{d^2x}{dt^2} + c\frac{dx}{dt} + kx + \beta x^3 = F \quad \text{[Formula 3]}$$

Figure 4:
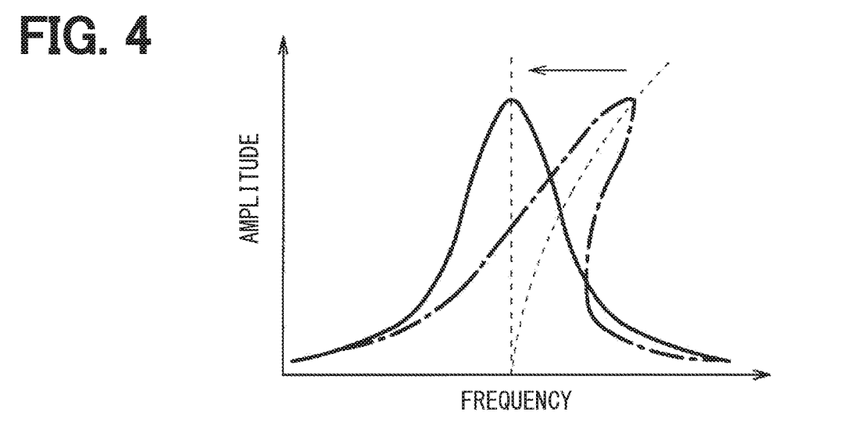
FIG. 4 is a diagram showing a relationship between a frequency of the input voltage and the amplitude of the movable electrode.

In the Formula 3, β is a coefficient determined by the material and shape of the active layer released from the sacrificial layer. Since the term $x^3$ has a finite value, the movable electrode 2 vibrates nonlinearly. Specifically, a resonance curve of the movable electrode 2 is inclined toward a high frequency side as shown by an alternate long and short dash line in FIG. 4, for example, and thus the vibration becomes unstable.

A hard spring effect in which the resonance curve is inclined toward the high frequency side is not dependent on the electrode structure and is observed when the displacement amount of the electrode is large. However, in the squeezed type electrostatic actuator, the electrostatic force becomes larger as the distance between the electrodes becomes smaller. Therefore, by increasing the input bias voltage, it is possible to cause the soft spring effect in which the resonance curve is inclined toward the low frequency side. In the present embodiment, the hard spring effect in a driven state of the slide type electrode pair 5 is reduced by the soft spring effect in the squeezed type electrode pair 6, thereby reducing the non-linear vibration as shown by the alternate long and short dash line in FIG. 4.

For example, when $V_1=V_{ac} \cos \omega t+V_{dc}$, $V_2=v_{ac} \cos \omega' t+v_{dc}$, and the electrostatic force in the electrode pair 5 and the electrode pair 6 is substituted into F of Formula 3, the equation of motion of the movable electrode 2 is represented by Formula 4. In Formula 4, $D_i=l (1/g)^{i-1}$, and as shown in FIG. 1, l is a length of the facing portion of the movable electrode 2 and the fixed electrode 3a.

$$m\frac{d^2x}{dt^2} + c\frac{dx}{dt} + \left\{k - 2\varepsilon_0 h D_3 \left(v_{dc}^2 + \frac{v_{ac}^2}{2}\right)\right\}x + \quad \text{[Formula 4]}$$
$$\left\{\beta - 4\varepsilon_0 h D_5 \left(v_{dc}^2 + \frac{v_{ac}^2}{2}\right)\right\}x^3 =$$
$$2\varepsilon_0 h\left\{\frac{n_0}{d_0}V_{dc}V_{ac}\cos\omega t - (D_2 + 3D_4 x^2)v_{dc}v_{ac}\cos\omega' t\right\}$$

By adjusting an arrangement parameter of the fixed electrode 3a and the input voltage, the coefficient of $x^3$ in Formula 4 can be made 0 (zero). As a result, as shown by a solid line in FIG. 4, the inclination of the resonance curve toward the high frequency side becomes 0 (zero).

As described above, in the present embodiment, by driving the movable electrode 2 with the input voltage to the electrode pair 5, as shown in FIG. 3, the amplitude of the movable electrode 2 with respect to the input power to the electrode pair 5 changes linearly. Further, the non-linear vibration of the movable electrode 2 when a voltage is applied to the electrode pair 5 is reduced by the force acting between the electrodes of the electrode pair 6. The controllability of the amplitude of the movable electrode 2 is improved.

Second Embodiment

A second embodiment will be described. In the present embodiment, the configuration of the fixed electrode is changed from that of the first embodiment, and the other points are the same as those of the first embodiment, and therefore only the portions different from the first embodiment will be described.

Figure 5:
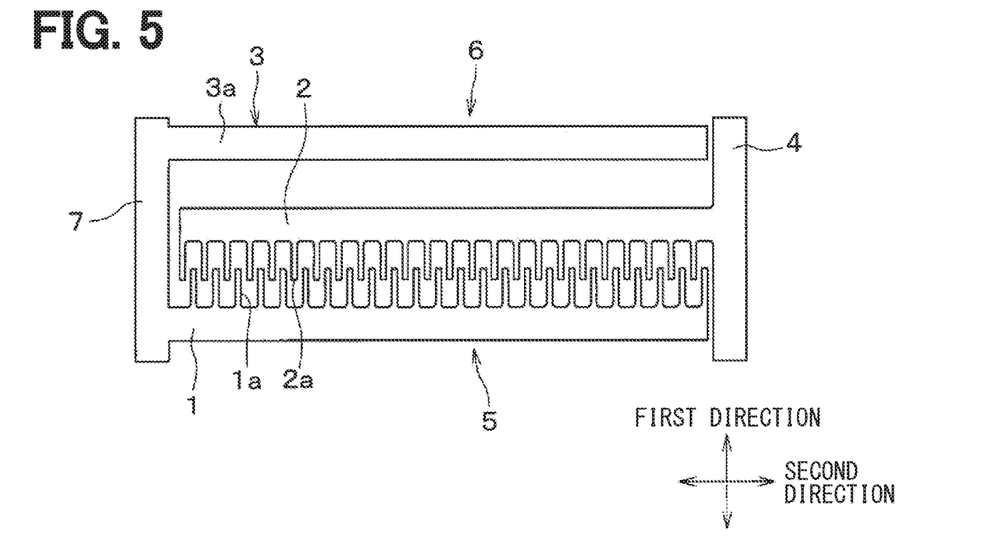
FIG. 5 is a plan view of an electrostatic actuator according to a second embodiment.

In the present embodiment, as shown in FIG. 5, the fixed electrode 1 and the fixed electrode 3a are connected by a beam portion 7 and are integrally configured. In such a configuration, the voltage $V_2$ applied to the electrode pair 6 changes periodically like the voltage $V_1$ applied to the electrode pair 5, and the equation of motion of the movable electrode 2 is expressed by Formula 5.

$$m\frac{d^2x}{dt^2} + c\frac{dx}{dt} + \left\{k - 2\varepsilon_0 h D_3 \left(V_{dc}^2 + \frac{V_{ac}^2}{2}\right)\right\}x + \quad \text{[Formula 5]}$$
$$\left\{\beta - 4\varepsilon_0 h D_5 \left(V_{dc}^2 + \frac{V_{ac}^2}{2}\right)\right\}x^3 =$$
$$2\varepsilon_0 h\left\{\frac{n_0}{d_0} - D_2 - 3D_4 x^2\right\}V_{dc}V_{ac}\cos\omega t$$

By designing each electrode so that the coefficient of the nonlinear term in Formula 5 becomes 0, it is possible to reduce the nonlinear vibration of the movable electrode 2 in the present embodiment as in the first embodiment.

Third Embodiment

A third embodiment will be described. Here, an example in which the electrostatic actuator is applied to the vibration type angular velocity sensor will be described, but the electrostatic actuator may be applied to another physical quantity sensor.

The vibration type angular velocity sensor described in the present embodiment is a sensor for detecting the angular velocity as a physical quantity, and is used, for example, to detect the rotation angular velocity around a center line parallel to a vertical direction of the vehicle. The vibration type angular velocity sensor can be applied to other than the vehicle.

Figure 6:
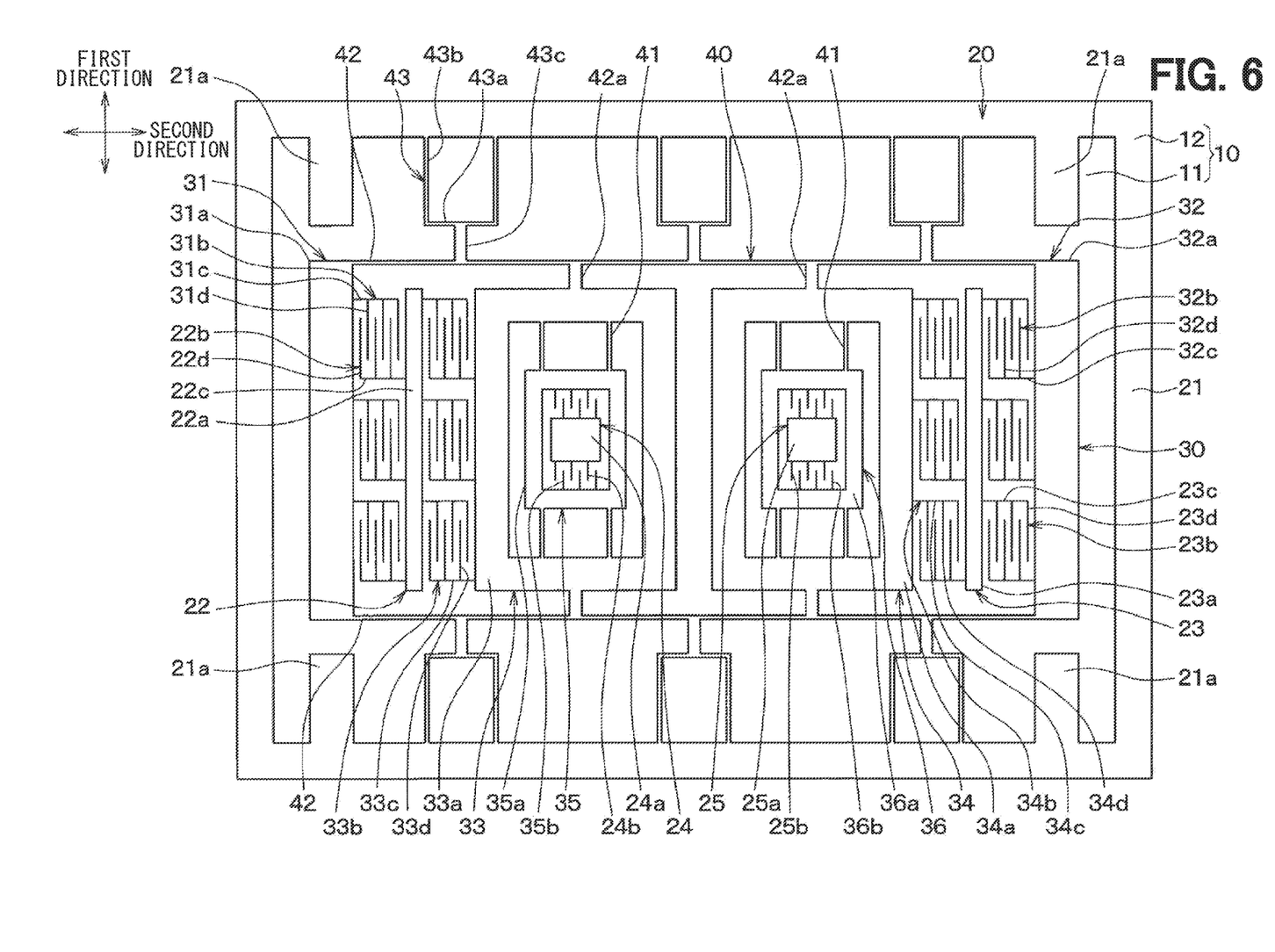
FIG. 6 is a plan view of a vibration type angular velocity sensor according to a third embodiment.

FIG. 6 is a schematic plan view of the vibration type angular velocity sensor according to the present embodiment. The vibration type angular velocity sensor is mounted on the vehicle such that a direction normal to the paper surface of FIG. 6 coincides with a vertical direction of the vehicle. The vibration type angular velocity sensor is formed on one surface side of the plate shaped substrate 10. The substrate 10 is an SOI substrate. The support layer of the substrate 10 is a support substrate 11, and the active layer is a semiconductor layer 12. The vibration type angular velocity sensor is constructed by the following process. The semiconductor layer 12 side is etched into the pattern of the sensor structure, a buried oxide film is partially removed, and a part of the sensor structure is released.

In the present embodiment, two directions parallel to the surface of the semiconductor layer 12 and perpendicular to each other are referred to as a first direction and a second direction, respectively, and a direction perpendicular to the surface of the semiconductor layer 12 is referred to as a third direction.

The semiconductor layer 12 is patterned into the fixed portion 20, the movable portion 30, and the beam portion 40. The fixed portion 20 has a state in which the buried oxide film is left on at least a part of its back surface and is fixed to the support substrate 11 via the buried oxide film without being released from the support substrate 11. The movable portion 30 and the beam portion 40 constitute a vibrator in the vibration type angular velocity sensor. The buried oxide film is removed from the back side of the movable portion 30 and the movable portion 30 is released from the support substrate 11. The beam portion 40 supports the movable portion 30 and displaces the movable portion 30 in the first direction and the second direction in order to detect the angular velocity. Specific structures of the fixed portion 20, the movable portion 30, and the beam portion 40 will be described.

The fixed portion 20 has a support fixed part 21 for supporting the movable portion 30, drive fixed parts 22 and 23 to which a drive voltage is applied, and detection fixed parts 24 and 25 used for detecting the angular velocity.

The support fixed part 21 is arranged so as to surround, for example, the other part of the fixed portion 20 (that is, the drive fixed parts 22 and 23 and the detection fixed parts 24 and 25) and the sensor structure such as the movable portion 30. The support fixed part 21 supports the movable portion 30 via the beam portion 40 on the inner wall thereof. Here, the structure in which the support fixed part 21 surrounds the entire periphery of the sensor structure is taken as an example, but the support fixed part 21 may be formed in only a part of the periphery.

The drive fixed parts 22 and 23 are composed of the drive fixed part 22 which is arranged between an outer drive weight 31 and an inner drive weight 33, and the drive fixed part 23 which is arranged between an outer drive weight 32 and an inner drive weight 34, as will be described later. These drive fixed parts 22 and 23 are configured to include bases 22a and 23a and comb-teeth-shaped drive fixed electrodes 22b and 23b. The drive fixed electrodes 22b and 23b correspond to the first fixed electrode.

The bases 22a and 23a extend in the first direction, and the plurality of drive fixed electrodes 22b and 23b are connected to the bases 22a and 23a. Then, an AC voltage (that is, a drive voltage) added to the DC voltage is applied from the outside through a bonding wire connected to a bonding pad (not shown) provided on the bases 22a and 23a. By applying a desired AC voltage to the bases 22a and 23a, the desired AC voltage is also applied to the drive fixed electrodes 22b and 23b.

The drive fixed electrodes 22b and 23b are comb-teeth-shaped electrodes which are arranged to face each of the comb teeth of the comb-teeth-shaped drive movable electrodes 31b, 32b, 33b, 34b provided on the outer drive weights 31 and 32 and the inner drive weights 33 and 34, as will be described later. Specifically, the drive fixed electrodes 22b and 23b include a plurality of support parts 22c and 23c extending in the second direction and a plurality of comb-teeth-shaped electrodes 22d, 23d extending in the first direction from the support parts 22c and 23c. The drive fixed electrodes 22b and 23b are configured such that a plurality of such structures are arranged along the first direction on both sides in the second direction of the bases 22a and 23a.

The detection fixed parts 24 and 25 are arranged in the detection weights 35 and 36 provided on the inner drive weights 33 and 34 as described later. The detection fixed parts 24 and 25 are configured to have bases 24a and 25a and detection fixed electrodes 24b and 25b.

Bonding pads (not shown) are provided on the bases 24a and 25a, and signals can be taken out to the outside via a bonding wire connected to the bonding pads. The detection fixed electrodes 24b and 25b are a plurality of comb-teeth-shaped electrodes extending in the first direction from the bases 24a and 25a, and are arranged to face each of the comb teeth of the comb-teeth-shaped detection movable electrodes 35b and 36b provided on the detection weights 35 and 36.

The movable portion 30 is a portion that is displaced according to the application of an angular velocity, and is configured to have outer drive weights 31 and 32, inner drive weights 33, 34, and detection weights 35, 36. The movable portion 30 has a layout in which the outer drive weight 31, the inner drive weight 33 including the detection weight 35, the inner drive weight 34 including the detection weight 36, and the outer drive weight 32 are sequentially arranged in the second direction. In other words, the movable portion 30 has a structure that two inner drive weights 33 and 34 in which the detection weights 35 and 36 are provided inside, and the outer drive weights 31 and 32 are further arranged on both outer sides so as to interpose the two inner drive weights 33 and 34.

The outer drive weights 31 and 32 are configured to have mass portions 31a and 32a and drive movable electrodes 31b and 32b.

The mass portions 31a and 32a are extended in the first direction. The mass portion 31a is arranged to face the base 22a of the drive fixed part 22, and the mass portion 32a is arranged to face the base 23a of the drive fixed part 23. The outer drive weights 31 and 32 are movable in the first direction by using the mass portions 31a and 32a as weights.

A part of the support fixed part 21 extends in the first direction toward the ends of the mass portions 31a and 32a and serves as a fixed electrode 21a. Four fixed electrodes 21a are formed, and end faces of the fixed electrodes 21a face end faces of the mass portions 31a and 32a in the first direction. In the present embodiment, the mass portions 31a and 32a and the fixed electrode 21a form the squeezed type electrode pair, and the movable portion 30 and the fixed electrode 21a correspond to the movable electrode and the second fixed electrode, respectively.

The drive movable electrodes 31b and 32b are comb-teeth-shaped electrodes that are arranged to face the comb teeth of the comb-teeth-shaped drive fixed electrodes 22b and 23b provided in the drive fixed parts 22 and 23, respectively. Specifically, the drive movable electrodes 31*b* and 32*b* include a plurality of support parts 31*c* and 32*c* extending in the second direction and a plurality of comb-teeth-shaped electrodes 31*d* and 32*d* extending in the first direction from the support parts 31*c* and 32*c*. The drive movable electrodes 31*b* and 32*b* are configured such that a plurality of such structures are arranged in the first direction on the side of the drive fixed parts 22 and 23 of the mass portions 31*a* and 32*a*. In this manner, the drive fixed electrodes 22*b* and 23*b* and the drive movable electrodes 31*b* and 32*b* form a slide-type electrode pair.

The inner drive weights 33 and 34 are configured to have mass portions 33*a* and 34*a* and drive movable electrodes 33*b* and 34*b*.

The mass portions 33*a* and 34*a* have a quadrangular frame shape, and the inner drive weights 33 and 34 are movable in the first direction by using the mass portions 33*a* and 34*a* as weights. Two opposing sides of each of the quadrangular mass portions 33*a* and 34*a* are parallel to the first direction and the second direction, and one of the sides parallel to the first direction is arranged to face the bases 22*a* and 23*a* of the the drive fixed parts 22 and 23. Specifically, one of the sides of the mass portions 33*a* and 34*a* parallel to the first direction is disposed to face the bases 22*a* and 23*a* of the drive fixed parts 22 and 23, and the drive movable electrodes 33*b* and 34*b* is are provided on the one side disposed to face the bases 22*a* and 23*a*.

The drive movable electrodes 33*b* and 34*b* are comb-teeth-shaped electrodes that are arranged to face the comb teeth of the comb-teeth-shaped drive fixed electrodes 22*b* and 23*b* provided in the drive fixed parts 22 and 23, respectively. Specifically, the drive movable electrodes 33*b* and 34*b* include a plurality of support parts 33*c* and 34*c* extending in the second direction and a plurality of comb-teeth-shaped electrodes 33*d*, 34*d* extending in the first direction from the support parts 33*c* and 34*c*. The drive movable electrodes 33*b* and 34*b* are configured such that a plurality of such structures are arranged in the first direction on the side of the drive fixed parts 22 and 23 of the mass portions 33*a* and 34*a*.

The detection weights 35 and 36 are configured to have mass portions 35*a* and 36*a* and detection movable electrodes 35*b* and 36*b*.

The mass portions 35*a* and 36*a* have a quadrangular frame shape, and are supported on the inner wall surfaces of the inner drive weights 33 and 34 via a detection beam 41 of a beam portion 40 described later. The detection weights 35 and 36 are moved in the first direction together with the inner drive weights 33 and 34, but the detection weights 35 and 36 are configured to be movable in the second direction by using the mass portions 35*a* and 36*a* as weights. The detection movable electrodes 35*b* and 36*b* are a plurality of comb-teeth-shaped electrodes extending in the first direction from the inner wall surfaces of the mass portions 35*a* and 36*a*, and are arranged so as to face each of the comb teeth of the comb-teeth-shaped detection fixed electrodes 24*b* and 25*b* which are provided in the detection fixed parts 24 and 25.

The beam portion 40 is configured to have a detection beam 41, a drive beam 42, and a support member 43.

The detection beam 41 is a beam which connects side of the inner wall surfaces of the mass portions 33*a* and 34*a* of the inner drive weights 33 and 34 that are parallel to the second direction with side of the outer wall surfaces of the mass portions 35*a* and 36*a* of the detection weights 35 and 36 that are parallel to the second direction. Since the detection beam 41 is displaceable in the second direction, the detection weights 35 and 36 can move in the second direction with respect to the inner drive weights 33 and 34 based on the displacement of the detection beam 41.

The drive beam 42 connects the outer drive weights 31 and 32 and the inner drive weights 33 and 34 and enables the outer drive weights 31, 32 and the inner drive weights 33 and 34 to move in the first direction. One outer drive weight 31, one inner drive weight 33, the other inner drive weight 34, and the other outer drive weight 32 are arranged in order, and are connected by a drive beam 42 in this state.

Specifically, the drive beam 42 is a linear beam having a predetermined width in the first direction, and each of the drive beams 42 is arranged on both sides which interposes the outer drive weights 31 and 32 and the inner drive weights 33 and 34 in the first direction. Each drive beam 42 is connected to the outer drive weights 31 and 32 and the inner drive weights 33 and 34. Although the drive beam 42 may be directly connected to the outer drive weights 31 and 32 and the inner drive weights 33 and 34, for example, in the present embodiment, the drive beam 42 and the inner drive weights 33, 34 are connected via the connecting portion 42*a*.

The support member 43 supports the outer drive weights 31 and 32, the inner drive weights 33 and 34, and the detection weights 35 and 36. Specifically, the support member 43 is provided between the inner wall surface of the support fixed part 21 and the drive beam 42, and supports the weights 31 to 36 on the support fixed part 21 via the drive beam 42.

The support member 43 is configured to have a rotary beam 43*a*, a support beam 43*b*, and a connecting portion 43*c*. The rotary beam 43*a* is a linear beam having a predetermined width in the first direction, the support beam 43*b* is connected to both ends thereof, and the connecting portion 43*c* is connected to a central position on the opposite side of the support beam 43*b*. When the sensor is driven, the rotary beam 43*a* undulates and bends in a S shape around the connecting portion 43*c*. The support beam 43*b* connects both ends of the rotary beam 43*a* to the support fixed part 21, and is a linear member in the present embodiment. The support beam 43*b* also has a role of allowing the weights 31 to 36 to move in the second direction when an impact or the like is applied. The connecting portion 43*c* has a role of connecting the support member 43 to the drive beam 42.

With the structure as described above, the vibration type angular velocity sensor is configured to have a pair of the angular velocity detection structures which are provided with two outer drive weights 31 and 32, two inner drive weights 33 and 34, and two detection weights 35 and 36, respectively.

Subsequently, a description will be given of an operation of the vibration type angular velocity sensor thus configured with reference to FIGS. 7 and 8.

First, the state of the basic operation of the vibration type angular velocity sensor will be described with reference to FIG. 7. By applying the AC voltage added to the DC voltage to the drive fixed parts 22 and 23, when a potential difference is generated between the outer drive weights 31 and 32 and the inner drive weights 33 and 34, an electrostatic force is generated in the first direction based on the potential difference. The drive weights 31 to 34 are vibrated in the first direction based on the electrostatic force.

Figure 7:
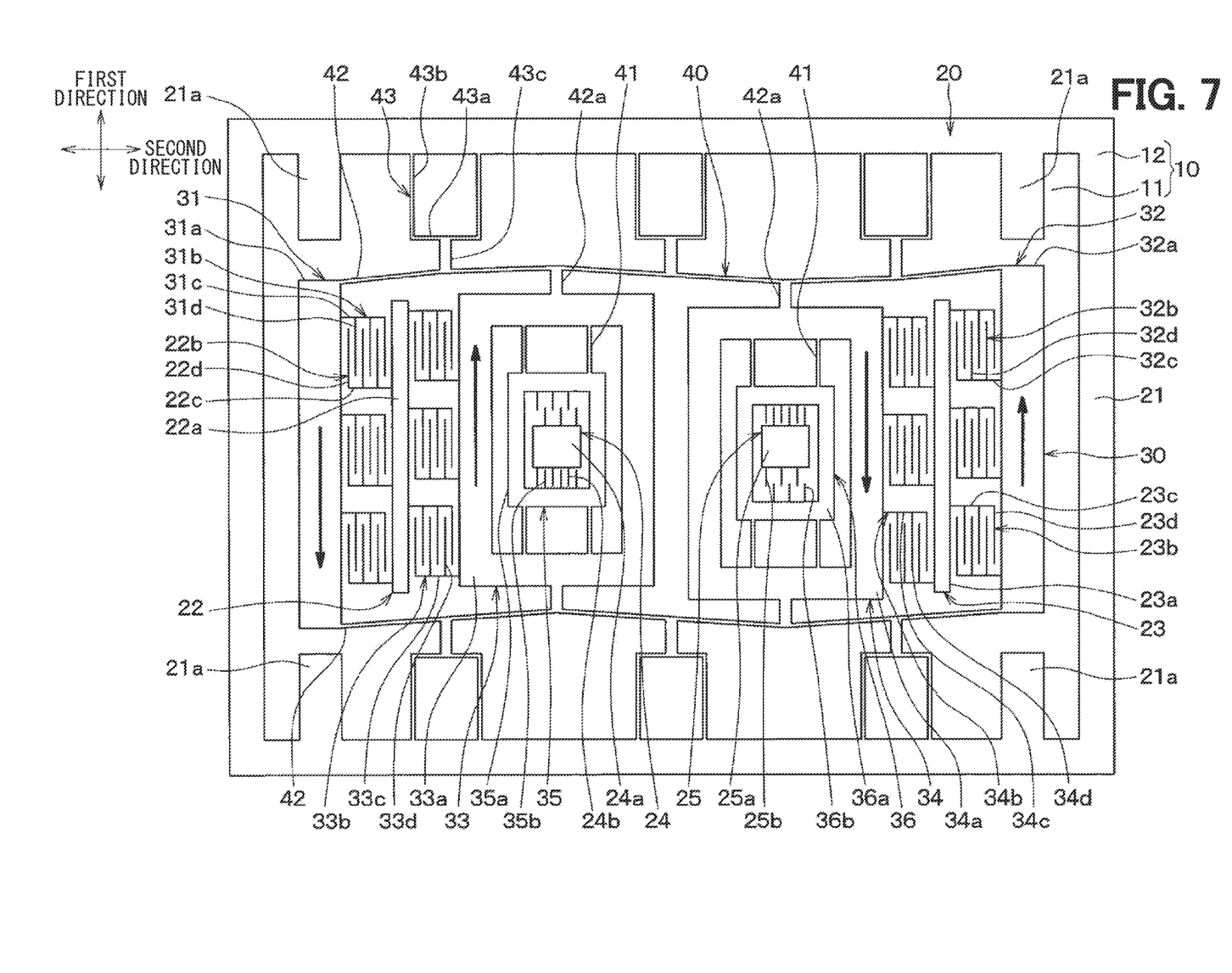
FIG. 7 is a plan view showing an operation of the vibration type angular velocity sensor according to the third embodiment.
Figure 8:
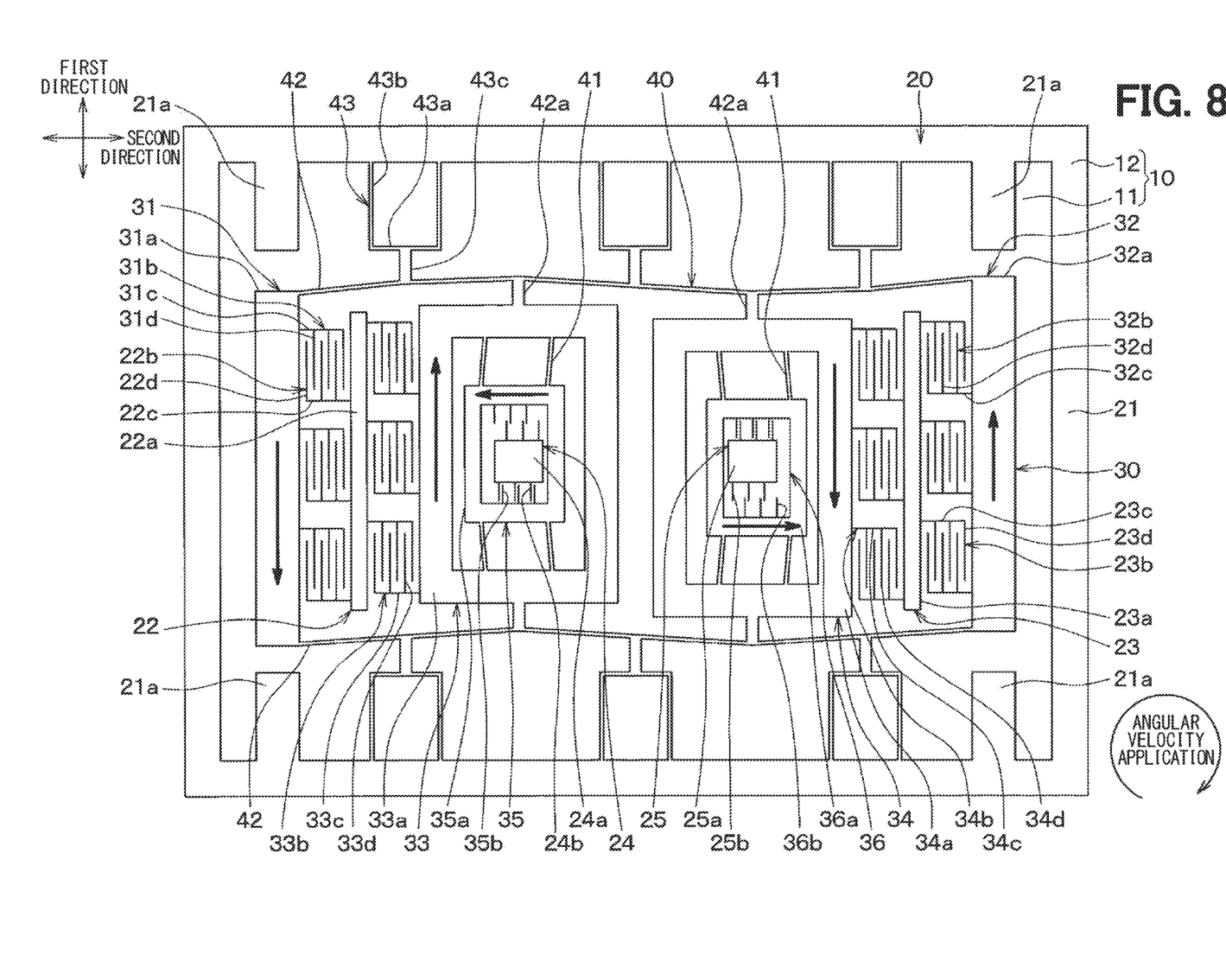
FIG. 8 is a plan view showing a state when an angular velocity is applied to the vibration type angular velocity sensor according to the third embodiment.

At this time, due to the arrangement of the drive fixed electrode 22*b*, the drive movable electrode 31*b*, and the drive movable electrode 33*b*, the outer drive weight 31 and the inner drive weight 33 are configured to vibrate in opposite phases in the first direction, as shown in FIG. 7. Further, due to the arrangement of the drive fixed electrode 23b, the drive movable electrode 32b, and the drive movable electrode 34b, the outer drive weight 32 and the inner drive weight 34 is configured to vibrate in opposite phases in the first direction, as shown in FIG. 7. Further, the two inner drive weights 33 and 34 are configured to vibrate in opposite phases in the first direction. As a result, the vibration type angular velocity sensor is driven in the drive mode shape.

At this time, the drive beam 42 corrugates in an S shape to allow the weights 31 to 34 to move in the first direction, but the connecting portion 43c that connects the rotary beam 43a and the drive beam 42 becomes a node of amplitude (that is, a fixed point), and thus has a structure that is hardly displaced.

Next, state when an angular velocity is applied to the vibration type angular velocity sensor will be described with reference to FIG. 8. When the angular velocity about an axis in the third direction is applied to the vibration type angular velocity sensor during the basic operation as shown in FIG. 7, due to the Coriolis force, the detection weights 35 and 36 are displaced in the second direction as shown in FIG. 8. Due to this displacement, a capacitance value of the capacitor configured by the detection movable electrode 35b and the detection fixed electrode 24b and a capacitance value of the capacitor configured by the detection movable electrode 36b and the detection fixed electrode 25b change.

Therefore, the angular velocity can be detected by reading a change in the capacitance value of the capacitor based on a signal extraction from the bonding pads of the detection fixed parts 24 and 25. For example, in the case of the configuration of the present embodiment, it is possible to differentially amplify the signals extracted from each of the two angular velocity detection structures and read the change in the capacitance value of the capacitor, so that the angular velocity can be detected more accurately. In this way, the applied angular velocity can be detected by the vibration type angular velocity sensor of the present embodiment.

When a voltage is applied to the slide type electrode pair and the squeezed type electrode pair in the same manner as in the first embodiment, the equation of motion of the movable electrode is represented by Formula 6 in the present embodiment.

$$m\frac{d^2x}{dt^2} + c\frac{dx}{dt} + \left\{k - 4\varepsilon_0 h D_3\left(v_{dc}^2 + \frac{v_{ac}^2}{2}\right)\right\}x +$$
$$\left\{\beta - 8\varepsilon_0 h D_5\left(v_{dc}^2 + \frac{v_{ac}^2}{2}\right)\right\}x^3 =$$
$$2\varepsilon_0 h\left\{\frac{n_0}{d_0}V_{dc}V_{ac}\cos\omega t - (D_2 + 3D_4 x^2)v_{dc}v_{ac}\cos\omega' t\right\}$$

[Formula 6]

By adjusting the shapes of the fixed electrode 21a, the drive fixed electrodes 22b and 23b, the movable portion 30 and the like, and setting the coefficient of $x_3$ in Formula 6 to 0, the inclination of the resonance curve of the movable portion 30 to the high frequency side can be 0 (zero).

As described above, also in the present embodiment, by using the slide type electrode pair and the squeezed type electrode pair in combination, the controllability of the amplitude of the movable electrode is improved as in the first embodiment. Therefore, when the vibration type angular velocity sensor operates as described above, it becomes possible to control the amplitude of the movable electrode with high precision, and the angular velocity detection precision is improved.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various combinations and configurations, which are preferred, other combinations and configurations, including more, less or only a single element, are also within the spirit and scope of the present disclosure.

Figure 9:
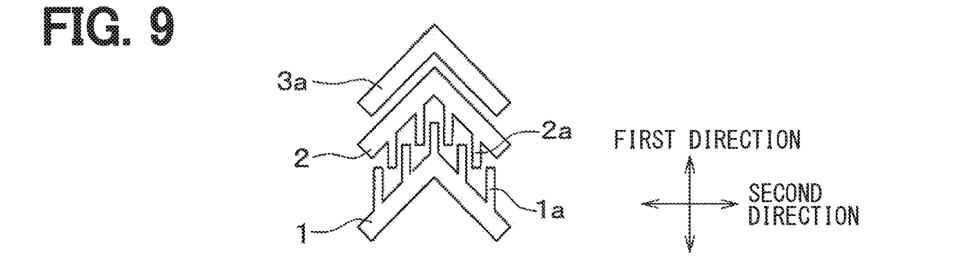
FIG. 9 is a plan view of an electrostatic actuator according to other embodiment.

For example, the surface of the fixed electrode 3a facing the movable electrode 2 may be concave, and the surface of the movable electrode 2 facing the fixed electrode 3a may be convex so as to correspond to the surface of the fixed electrode 3a. For example, as shown in FIG. 9, the fixed electrode 1, the movable electrode 2, and the fixed electrode 3a may be bent so as to be convex toward one side in the first direction.

Further, the portions of the fixed electrode 1, the movable electrode 2, and the fixed electrode 3a that face each other may have a shape symmetrical with respect to an axis parallel to the first direction as a whole. The protrusions 1a and 2a do not have to be arranged at equal intervals. For example, in the configuration shown in FIG. 9, if the fixed electrode 1 or the like has a symmetrical shape with respect to an axis parallel to the first direction passing through the center of the fixed electrode 1 or the like, a distance between the protrusion 1a and the protrusion 2a in the central portion may be different from a distance between the protrusion 1a and the protrusion 2a at both ends.

Figure 10:
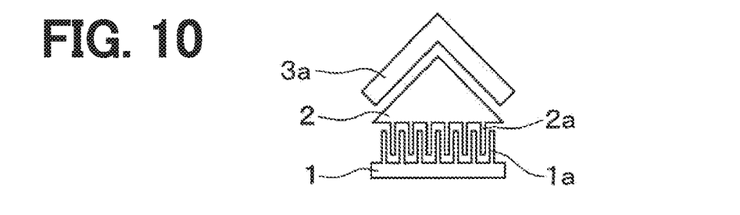
FIG. 10 is a plan view of an electrostatic actuator according to other embodiment.

Further, as shown in FIG. 10, the fixed electrode 3a may have a bent shape, the surface of the movable electrode 2 facing the fixed electrode 3a may have a convex shape, and the fixed electrode 1 may have a rod shape. Further, in the examples shown in FIGS. 9 and 10, the fixed electrode 3a and the like may be curved in an arc shape.

Figure 11:
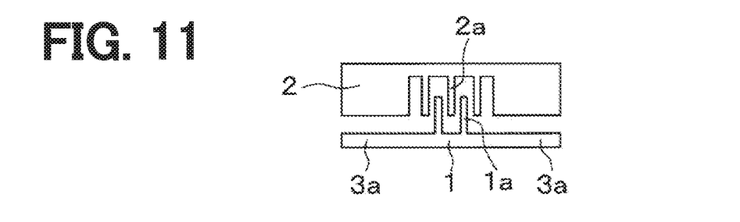
FIG. 11 is a plan view of an electrostatic actuator according to other embodiment.

Further, the fixed electrode 3a may be arranged on the same side as the fixed electrode 1 with respect to the movable electrode 2. For example, as shown in FIG. 11, the central portion of the rod-shaped electrode may be a comb-teeth-shaped fixed electrode 1, both ends thereof may be fixed electrodes 3a, the central portion of the movable electrode 2 facing the fixed electrode 1 may be a comb-teeth-shaped, and surfaces of the movable electrode 2 facing the fixed electrodes 3a at both ends may be flat. Further, in FIG. 11, the fixed electrode 1 and the fixed electrode 3a may be configured as separate bodies.

Further, the electrostatic actuator may have a plurality of configurations shown in FIG. 1 and so on. When n pieces of the configuration shown in FIG. 1 are arranged in the vertical direction of the paper surface of FIG. 1, $D_i = nl(1/g)_{i-1}$.

Figure 12:
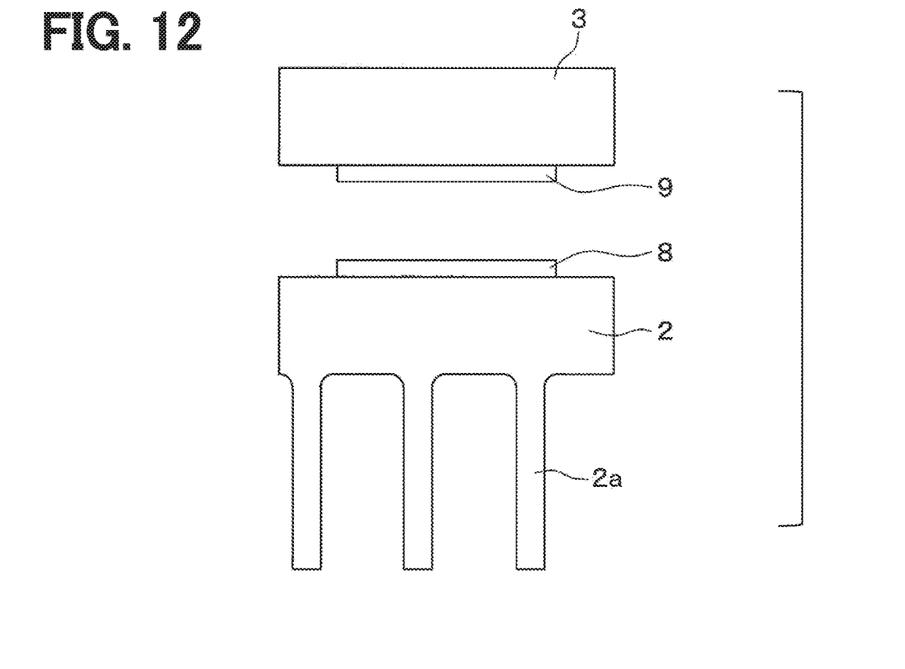
FIG. 12 is a plan view of an electrostatic actuator according to other embodiment.

Further, the non-linear vibration of the movable electrode 2 may be reduced by a force other than the electrostatic force acting between the electrodes of the electrode pair 6. For example, as shown in FIG. 12, magnets 8 and 9 are provided on the surfaces of the movable electrode 2 and the fixed portion 3 that face each other, and the non-linear vibration of the movable electrode 2 may be reduced by an attractive force of the magnet 8 formed on the movable electrode 2 and the magnet 9 formed on the fixed portion 3.

Figure 13:
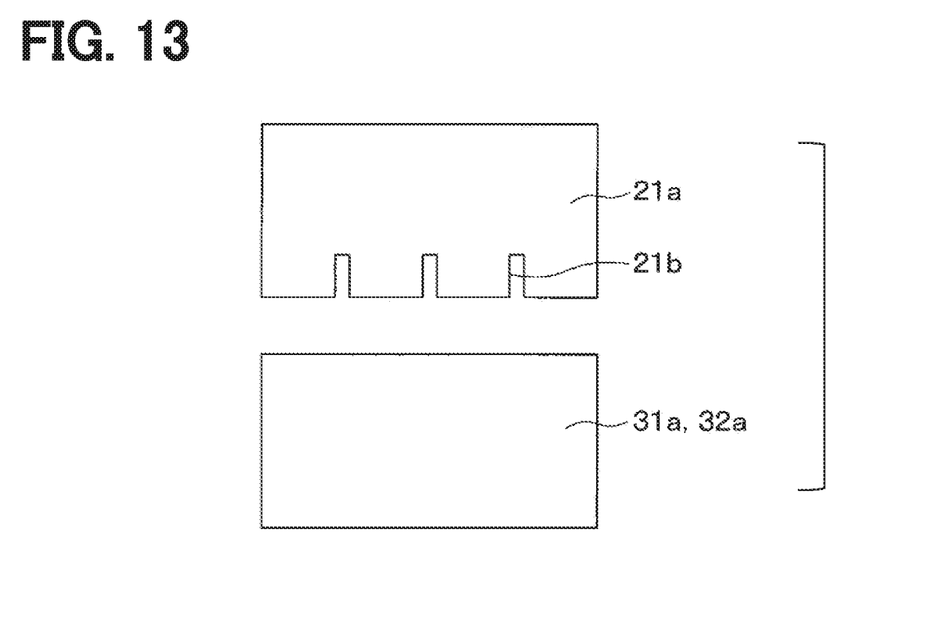
FIG. 13 is a plan view of an electrostatic actuator according to other embodiment.
Figure 14:
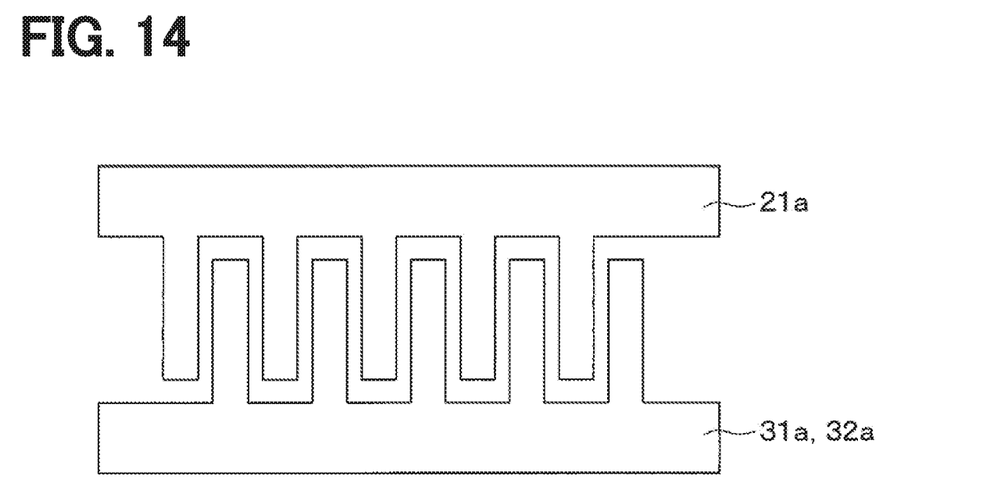
FIG. 14 is a plan view of an electrostatic actuator according to other embodiment.

Further, in the third embodiment, as shown in FIG. 13, slits 21b may be formed on the surface of the fixed electrode 21a that faces the mass portions 31a and 32a. Further, as shown in FIG. 14, the portions of the fixed electrode 21a and the mass portions 31a and 32a that face each other are comb-teeth-shaped, and the ends of the comb teeth and the portions that face the ends may be the squeezed type electrode pair. In the configurations shown in FIGS. 13 and 14, when the mass portions 31a and 32a are displaced, the gas between the fixed electrode 21a and the mass portions 31a and 32a escapes from the slits 21b and the gaps between the comb teeth, so that it is possible to reduce the influence of the viscosity of the gas on the displacement of the mass portions 31a and 32a.

What is claimed is:

1. An electrostatic actuator, comprising:
a fixed electrode having a rod shape and a surface extending in a longitudinal direction; and
a movable electrode having a rod shape and a surface extending in a longitudinal direction and being arranged such that the surface faces the longitudinally extending surface of the fixed electrode, wherein
the movable electrode is configured to be displaceable with respect to the fixed electrode and a fixed portion, and the actuator is configured such that an attractive force acts between the movable electrode and the fixed portion,
the fixed electrode is regarded as a first fixed electrode,
a part of the fixed portion having a rod shape is regarded as a second fixed electrode,
the first fixed electrode is formed with a plurality of first protrusions that protrude in a first direction perpendicular to the longitudinal direction from the longitudinally extending surface of the first fixed electrode on one end side facing the longitudinally extending surface of the movable electrode,
the movable electrode is formed with a plurality of second protrusions that protrude in the first direction from the longitudinally extending surface of the movable electrode on one end side facing the longitudinally extending surface of the fixed electrode,
the plurality of first protrusions and the plurality of second protrusions are arranged alternately in a second direction along the longitudinal direction,
the second fixed electrode has a flat surface extending along a length of the second fixed electrode in a longitudinal direction on one end side,
the movable electrode has a flat surface on the other side extending along a length of the movable fixed electrode in the longitudinal direction and faces the flat surface of the second fixed electrode,
a first electrode pair is constituted by the first fixed electrode and the movable electrode, and
a second electrode pair is constituted by the second fixed electrode and the movable electrode.

2. The electrostatic actuator according to claim 1, wherein the first fixed electrode and the second fixed electrode are configured as separate bodies.

3. The electrostatic actuator according to claim 1, wherein the first fixed electrode and the second fixed electrode are integrally formed.

4. The electrostatic actuator according to claim 1, wherein
the first fixed electrode and the movable electrode are comb-shaped,
the movable electrode is configured to be displaceable in the protruding direction of the first protrusions and the second protrusions, and
a distance between the electrodes of the second electrode pair is changed by the displacement of the movable electrode in the protruding direction.

5. The electrostatic actuator according to claim 4, wherein
the first fixed electrode, the second fixed electrode, and the movable electrode have a symmetrical shape with respect to an axis parallel to the protruding direction of the first protrusions and the second protrusions.

6. The electrostatic actuator according to claim 4, wherein
the first protrusions and the second protrusions are arranged at equal intervals.

7. A physical quantity sensor, comprising:
a drive weight,
a movable electrode for detection,
a fixed electrode for detection, and
the electrostatic actuator according to claim 1, wherein
when a physical quantity is applied while the drive weight is being driven and vibrated, the movable electrode for detection is displaced together with the detection weight, so that the physical quantity is detected by changing a distance between the movable electrode for detection and the fixed electrode for detection.

8. The physical quantity sensor according to claim 7, wherein
a slit is formed on a surface of the fixed portion facing the movable electrode.

* * * * *